(12) United States Patent
Radens et al.

(10) Patent No.: US 6,255,683 B1
(45) Date of Patent: Jul. 3, 2001

(54) DYNAMIC RANDOM ACCESS MEMORY

(75) Inventors: Carl Radens, LeGrangeville; Ulrike Gruening, Wappingers Falls, both of NY (US); John DeBrosse, Burlington, VT (US); Jack Mandelman, Stormville, NY (US)

(73) Assignees: Infineon Technologies AG, Munich (DE); International Business Machines, Armonk, NY (US)

( * ) Notice: Subject to any disclaimer, the term of this patent is extended or adjusted under 35 U.S.C. 154(b) by 0 days.

(21) Appl. No.: 09/222,391

(22) Filed: Dec. 29, 1998

(51) Int. Cl.[7] ............................. H01L 29/76; H01L 29/94
(52) U.S. Cl. ............................. 257/301; 438/242
(58) Field of Search ....................... 257/296, 309, 257/330, 301, 315, 333, 298, 513, 302, 300; 438/717, 258, 253, 242, 147, 386, 735, 388

(56) References Cited

U.S. PATENT DOCUMENTS 6,074,909 * 6/2000 Gruening .......................... 438/242

* cited by examiner

Primary Examiner—Matthew Smith
Assistant Examiner—Calvin Lee
(74) Attorney, Agent, or Firm—Stanton C. Braden

(57) ABSTRACT

A memory cell formed in a semiconductor body includes a vertical trench with a polysilicon fill as a storage capacitor and a field effect transistor having a source formed in the sidewall of the trench, a drain formed in the semiconductor body and having a surface common with a top surface of the semiconductor body, and having a channel region that includes both vertical and horizontal portions and a polysilicon gate that is in an upper portion of the trench. A process for fabrication provides an insulating oxide layer at the top of the polysilicon fill portion that serves as the storage node and the polysilicon fill portion that serves as the gate conductor.

2 Claims, 6 Drawing Sheets

DYNAMIC RANDOM ACCESS MEMORY

FIELD OF THE INVENTION

This invention relates to a dynamic random access memory (DRAM), and more particularly, to a DRAM that comprises a semiconductor chip (body) in which an array of memory cells are arranged in rows and columns, each memory cell including a switch in series with a storage capacitor in which bits are written in and read out under control of the switch.

BACKGROUND OF THE INVENTION

DRAMs of the kind that use a switch in series with a capacitor for storage are among the most important of all integrated circuits. A continuing trend in DRAMs is the increase in the number of memory cells that are stored in a single chip, a number that is now in the millions and is still increasing.

It is desirable to decrease the size of individual memory cells of the array so as to increase the capacity of DRAMs while limiting the size of the semiconductor chip. A popular memory cell uses an n-channel metal oxide semiconductor transistor (MOSFET), also known as an insulated gate field effect transistor (IGFET), as the switch and a capacitor. The use of a storage capacitor that is formed as a deep vertical trench in the chip, adjacent the transistor with which it is in series, is widespread. Associated with such a trend is a trend towards the use of a vertical transistor formed at the top of the trench to increase still further the number of cells that can be formed in a single semiconductor chip.

A problem that has arisen in a memory cell that uses both a vertical trench storage capacitor and a vertical transistor is providing conveniently the necessary isolation between the storage capacitor and the transistor.

SUMMARY OF THE INVENTION

In one aspect, the present invention is directed to a method for forming in a semiconductor body a memory cell that positions its storage node in a polysilicon-filled vertical trench and its transistor in part along a sidewall of the trench in a manner that results in better dielectric isolation between the storage capacitor and the transistor. A plurality of these memory cells are simultaneously formed in the semiconductor body to form a DRAM.

A key factor in the process is the use of the node dielectric layer as an oxidation barrier for the growth of an additional silicon oxide layer at the top of the trench for isolating the gate electrode of the transistor from the storage node. Another important factor is the use of a raised shallow trench filled with silicon oxide for better separating the gate conductor and the storage node.

In an illustrative embodiment, there is formed in a semiconductor body {e.g., a monocrystalline silicon body (substrate)} a deep vertical trench after which a relatively thick LOCOS type collar is formed along its upper portion and a silicon nitride storage node dielectric layer over the walls of the trench including the oxide collar. The trench is then filled with doped polysilicon after which a recess is formed at the top of the fill. Now the top portion of the remaining polysilicon fill is oxidized to form an oxide layer over the top of the trench polysilicon fill (the trench top oxide). Now the semiconductor body is exposed to a wet isotropic etch that bares the sidewalls of the top of the trench of any dielectric layer and also etches away a portion of the oxide collar surrounding the top of the polysilicon fill of the trench but leaves a portion of the trench top oxide layer stranded at the top of the polysilicon fill. Now there is deposited a layer of doped silicon over the top of the wafer including the trench for surrounding the sides of the stranded trench top oxide layer. This wall layer will provide the conductive strap linking the doped polysilicon fill of the trench and the source of the vertical transistor that will be formed along the sidewall of the trench. Now the surrounding silicon layer is largely stripped away to leave only a portion on the sidewall of the trench that surrounds the sides of the oxidation layer over the top of the trench polysilicon fill. This will serve the roles just mentioned. Now there is grown a new oxide layer over the semiconductor body including the trench top oxide. This new oxide layer will serve as the gate dielectric of the vertical transistor and to isolate further the previously-mentioned link silicon portion from the doped polysilicon that is now deposited over the top of the semiconductor body to fill the upper portion of the trench. This new polysilicon layer will provide the gate and the gate conductor of the vertical transistor. This gate conductor polysilicon layer is now patterned to provide space for the shallow trench that will be filled with silicon oxide that will provide isolation between the memory cells of the DRAM.

The rest of the process is essentially the same as in the shallow trench isolation prior art. The drain of the transistor is formed in the monocrystalline silicon adjacent the trench and the channel between the source and drain includes both a vertical portion in the bulk monocrystalline silicon along a sidewall of the trench and a horizontal portion in the top surface of the monocrystalline silicon.

Viewed from one aspect, the present invention is directed to a memory cell for use in a dynamic random access memory of the kind that uses a transistor and a storage capacitor in a semiconductor body. The memory cell comprises a relatively deep trench and a transistor. The trench has substantially vertical side walls that includes a deep portion that is filled with doped polysilicon, that is insulated from the semiconductor body by a dielectric layer and that serves as the storage node of the memory cell, the polysilicon fill also including an oxide layer at its top. The transistor includes a drain region that is part of the semiconductor body and a source region that lies in the semiconductor body along a sidewall at the top of the polysilicon fill of the deeper portion of the trench, and a channel region extending between the source and drain regions along the top surface of the semiconductor body and along a sidewall of the deep trench that includes vertical and horizontal portions, and a doped silicon gate conductor that fills the upper portion of the trench and is electrically insulated from the doped polysilicon in the deeper portion of the trench both by a dielectric layer that was formed at the top of the polysilicon fill in the deeper portion of the trench and a dielectric layer that was formed as part of the gate dielectric of the transistor.

The invention will be better understood from the following more detailed description taken in conjunction with the accompanying drawing.

BRIEF DESCRIPTION OF THE DRAWING

It should be noted that the drawing is not necessarily to scale and are not true cross sections in that some back lines of trenches and other openings are not shown.

DETAILED DESCRIPTION

Figure 1:
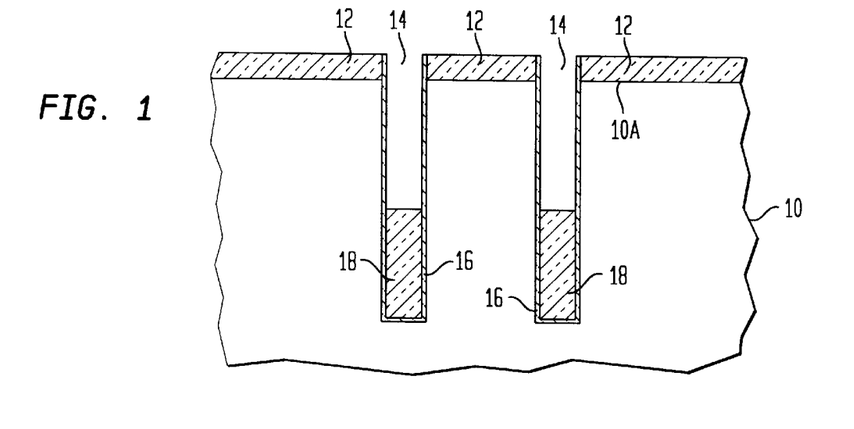
FIGS. 1–14 are cross sections of a portion of a semiconductor body (e.g., a monocrystalline silicon wafer) in which there is being formed a pair of memory cells for use in a DRAM, at various stages in their formation, in accordance with the present invention.

FIG. 1 shows a portion of a semiconductor body (e.g., a silicon wafer, substrate) 10 in which there is to be formed a pair of memory cells in accordance with the present invention. As is known, in the manufacture of DRAMs, it is customary to use as the workpiece being processed a relatively large silicon wafer in which are formed initially the basic structures of a number of DRAMs and which will eventually be diced into many discrete silicon chips, each of which houses one or more DRAMs. It will be convenient in many respects to discuss the process of forming the DRAMs with reference to just a limited portion of the semiconductor body.

In the illustrative embodiment being described, one begins with a semiconductor body 10, (e.g., a monocrystalline silicon wafer) that includes a top surface 10A. The memory cells to be formed in the semiconductor body 10 will use n-channel MOSFETS as the switches. Typically the auxiliary circuits needed for writing in and reading out bits in the memory will be formed in a peripheral region surrounding a central array region where the memory cell array is formed and some of such circuit elements will be formed in surface wells of n-type conductivity doping.

As is known in the art, there is possible the use of a variety of different forms of starting semiconductor bodies. The semiconductor body can simply be a uniformly doped semiconductor substrate, a silicon epitaxial layer on a semiconductor substrate or an insulator, or a well formed of a particular conductivity in a semiconductor substrate of a different conductivity. Also it is feasible for the memory cells to use p-channel MOSFETS for the switches.

The illustrative process begins with the formation of separated deep vertical trenches 14 in the semiconductor body 10. To this end, the top surface 10A of the semiconductor body 10 is covered with a standard PAD layer 12. This PAD layer 12 typically is a multilayer including a relatively thin underlying layer of silicon oxide and a thicker overlying layer of silicon nitride.

PAD layer 12 is patterned to expose the underlying silicon where the relatively deep trenches 14 are to be formed. The trenches 14 are formed, typically by anisotropic reactive ion etching (RIE), to have essentially vertical sidewalls. After a trench 14 is formed, the walls of the trench are lined with an oxidation barrier layer 16 of a suitable dielectric, typically silicon nitride. Then the trench 14 is filled with a suitable resist 18 and the resist is recessed to leave exposed the sidewalls of only a top portion of the trench 14. The result is shown in FIG. 1. The semiconductor body 10 is typically of p-type conductivity silicon whose top surface 10A is covered with the patterned PAD layer 12 to form the trenches 14 whose sidewalls are covered with a dielectric layer 16 and which are partially filled with a resist 18.

Figure 2:
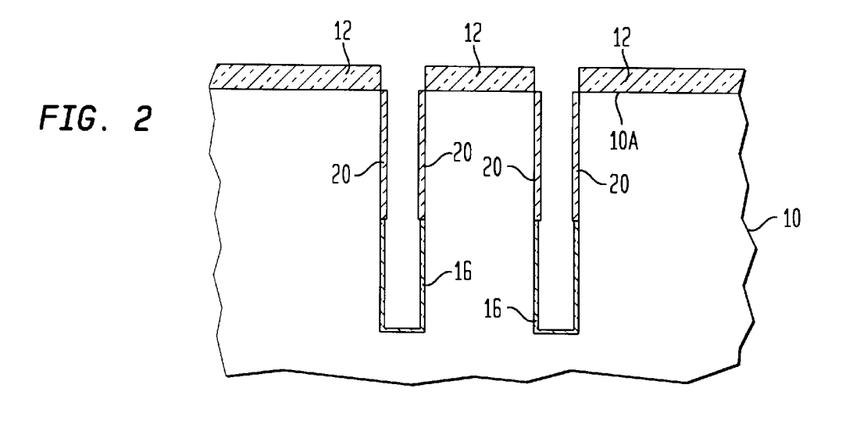
Figure 3:
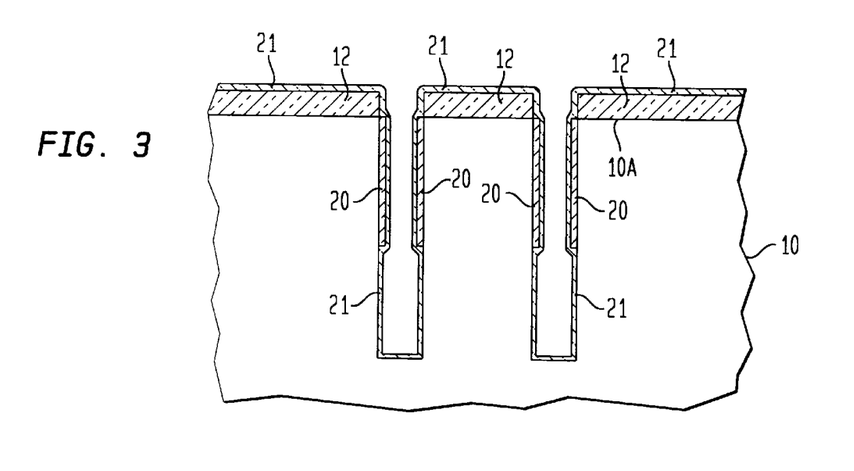

Next, the dielectric layer 16 on the exposed sidewalls of trenches 14 is stripped by etching and the resist 18 that is still buried in the trench 14 is removed in any suitable fashion, as shown in FIG. 2. A silicon dioxide layer 20 is grown by thermal oxidation in the upper region of the trench masked by the barrier layer 16 in the lower region of the trench. This leaves the sidewalls of the upper portion of the trench 14 covered with the relatively thick silicon oxide collar 20 and the remainder of the trench 14 wall covered with the relatively thin dielectric layer 16. Now the remainder of the silicon nitride barrier layer 16 that had been covered by the photoresist 18 is removed. Next, a layer 21, suitable for use as the node dielectric layer of the storage capacitor to be formed, is formed over the walls of the trench 14, as is shown in FIG. 3. This layer 21 typically will be a combination of silicon oxide layer and a silicon nitride layer.

Figure 4:
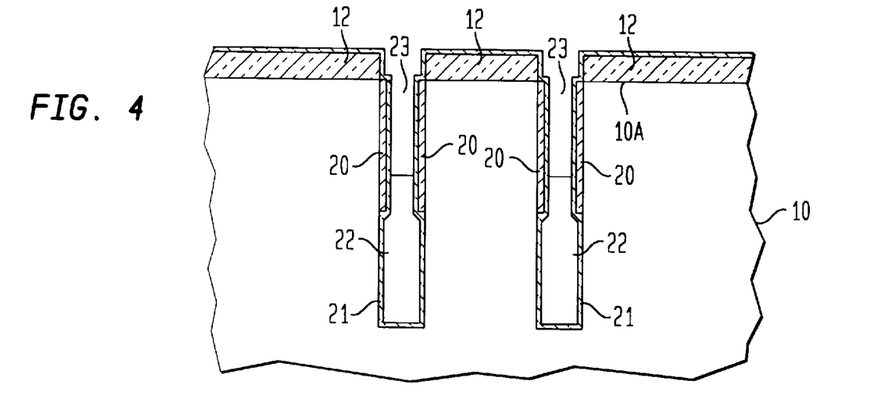

Now the trench 14 is filled with n-type doped polysilicon 22. Typically to this end, the trench 14 is overfilled and then the top surface 10A of the semiconductor body 10 is planarized, using the PAD layer 12 as an etch stop. Typically the planarization is done by chemical mechanical polishing (CMP). After this trench 14 is filled and planarized, reactive ion etching or dry etching is used to form a recess 23 at the top of the polysilicon fill 22 of the trench. The result is shown in FIG. 4 with the polysilicon fill 22 being shown recessed at the top. A layer 21 remains deposited over the collar layer 20 in the recess 23.

Figure 5:
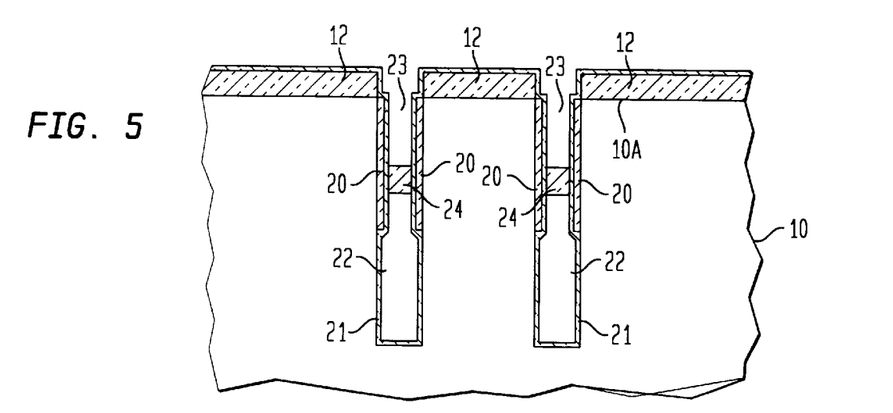

At this point, a top portion of the polysilicon fill 22 of the trench is oxidized, advantageously by heating the semiconductor body 10 in an oxidizing atmosphere to form a trench top oxide (TTO) layer 24, as is shown in FIG. 5. The remaining silicon nitride 21 serves to protect the sidewalls of the unfilled top portion of the trench 14 during such oxidation.

Figure 6:
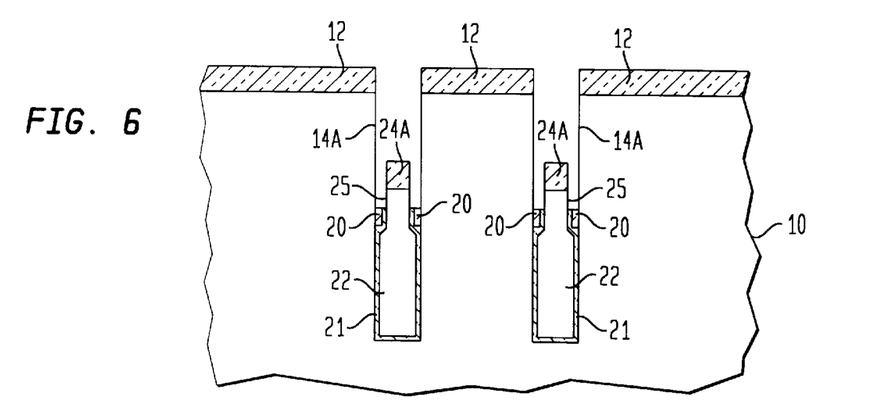

Now the semiconductor body 10 is subjected to a wet etch that can etch both silicon nitride and silicon oxide to etch the exposed silicon oxide and silicon nitride to leave the result shown in FIG. 6, where there is shown exposed the semiconductor body 10 along the upper sidewall portion 14A of the trench 14 where the top portion of the collar 22 has been removed. There is also exposed a top portion 25 of the sidewalls of the polysilicon fill 22. The TTO layer 24, which though reduced in height by the etching, still has a portion 24A that remains on top of the trench polysilicon fill 22. This top portion 25 of the sidewalls of the polysilicon fill 22 will be used to provide a low resistance connection between the polysilicon fill 22 remaining in the trench, which is the storage node of the capacitor, and the vertical transistor to be formed at the sidewall 14A of the trench 14.

Figure 7:
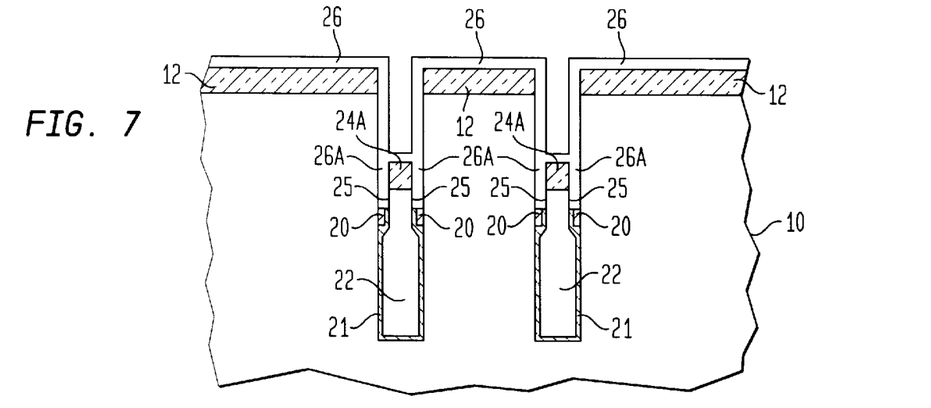

To this end, the semiconductor body 10 is now exposed to a low pressure chemical vapor deposition (LPCVD) process for depositing n-doped polysilicon layer 26 over exposed surfaces of the semiconductor body 10 including the exposed surfaces in the trench 14. The result is shown in FIG. 7. As seen, the layer 26 includes a strap portion 26A that makes contact with the polysilicon fill at the previously exposed surface 25.

Figure 8:
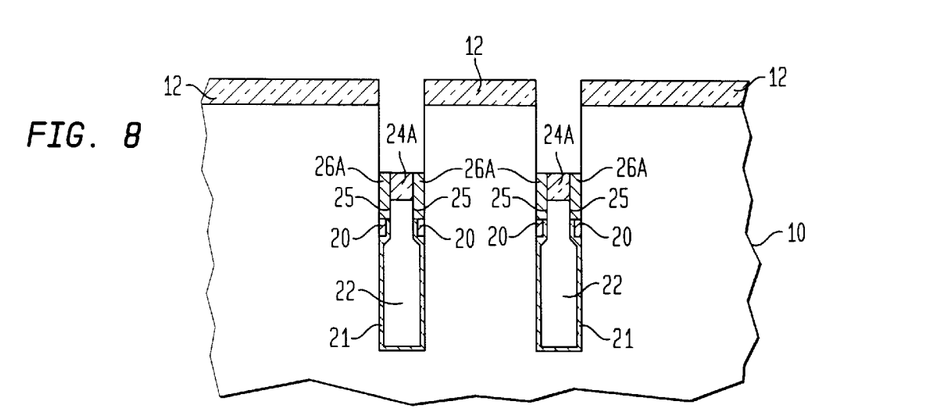

Then the semiconductor body 10 is subjected to another isotropic etching operation to remove most of the exposed silicon layer 26 but leaving the strap portion 26A that makes contact with the polysilicon fill at its previously exposed surface 25, as shown in FIG. 8.

Figure 9:
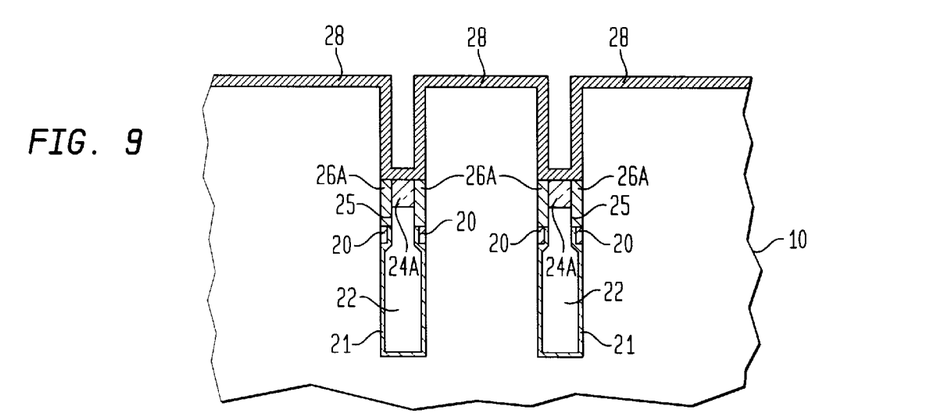

This heavily n+ type doped strap portion 26A will, in the course of the heating that occurs in the further processing, provide n-type dopants that will out-diffuse and form an n+ type conductivity source region 43 (shown in FIG. 14) of the transistor to be formed in the monocrystalline silicon adjacent thereto. Now there is removed the remaining PAD layer 12 on the surface 10A to expose the underlying silicon and a layer of silicon oxide 28 is formed over the exposed surfaces of the semiconductor body 10, including both the planar top surface 10A and the exposed trench sidewalls and the top trench oxide 24A, as is shown in FIG. 9. This oxide layer 28 is designed to furnish the gate dielectric of the vertical transistor that is to be formed along the side of trench 14, and it also adds to the electric isolation provided by the remaining portion 24A of the TTO layer 24.

Figure 10:
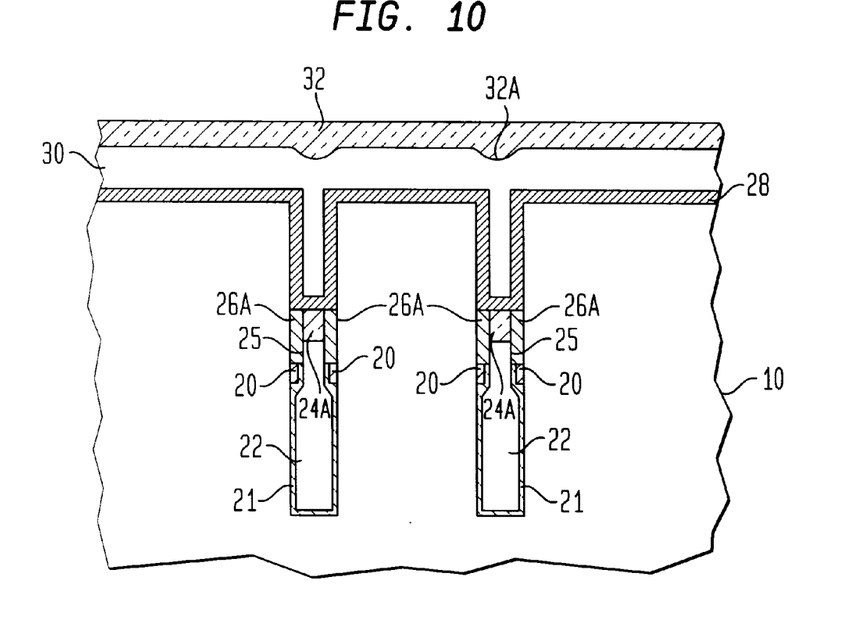

Now there is deposited over the surface in turn a layer of heavily doped polysilicon 30 suitable for use as the gate conductor (gate) of the vertical transistors to be formed and a layer of silicon nitride 32, as is shown in FIG. 10. The doping of this layer is chosen to be appropriate for having polysilicon layer 30 serve as the gate electrode of the transistor. The polysilicon layer 30 will typically have an indentation 32A, approximately centered over each of the deep trenches, that can be useful for registration control purposes.

Figure 11:
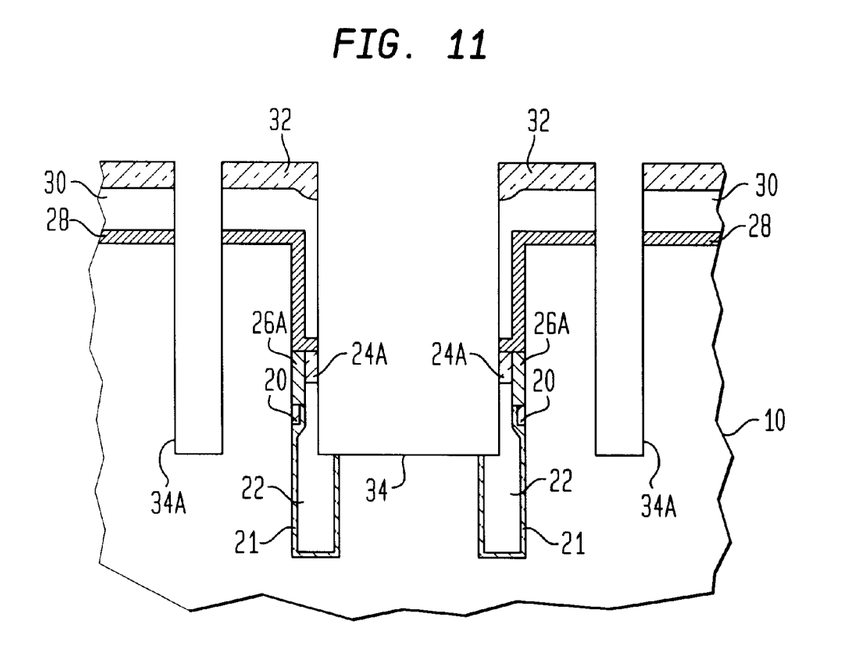

The silicon nitride layer 32 is then patterned to expose a central portion of the semiconductor body 10 that is to be filled with silicon oxide 36 that will serve to isolate from one another the two cells being formed in this portion of the semiconductor body 10 and to expose portions of semiconductor body 10 on both sides of the two original trenches 14. As is shown in FIG. 11, there has now been formed a isolation trench 34 centrally located over the two original deep trenches 14. Trench 34 has portions 34A on both sides of the two original trenches 14. Actually, although not seen in this figure, this trench 34 is a continuous trench isolating from one another all the deep trenches 14 in the array and the trench portions 34A are a part of this trench 34 that will isolate the pair of original deep trenches 14 from adjacent pairs (not shown) of deep trenches 14.

Figure 12:
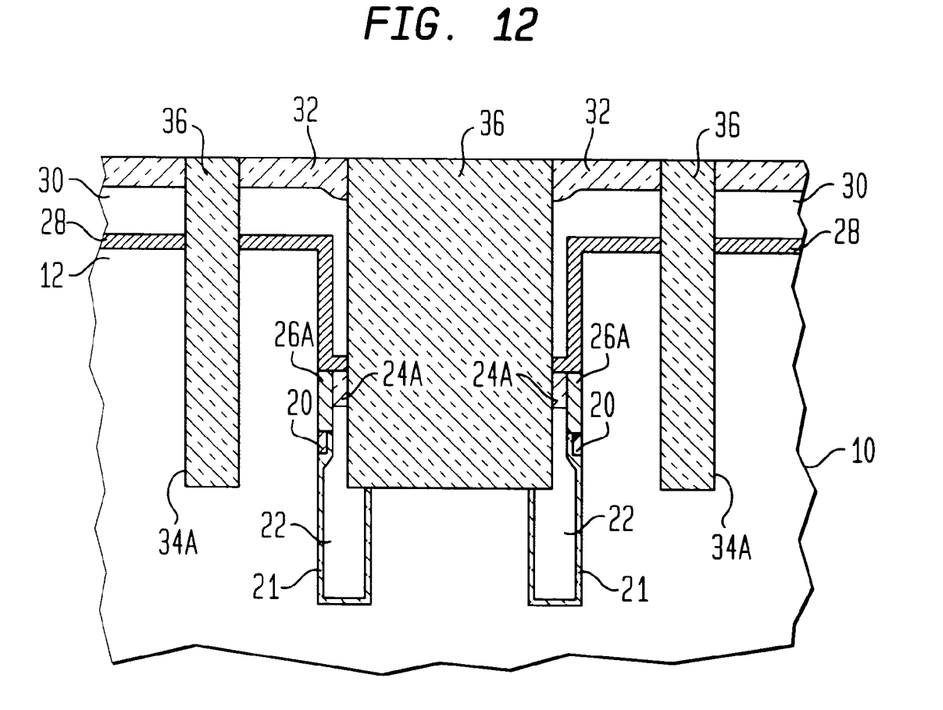

Now silicon oxide 36 that provides the trench isolation is deposited over the surface 10A of the semiconductor body 10 and planarized by CMP stopping on the PAD layer 32 to provide the silicon oxide fill 36 in the continuous trench 34 to arrive at the structure shown in FIG. 12.

Figure 13:
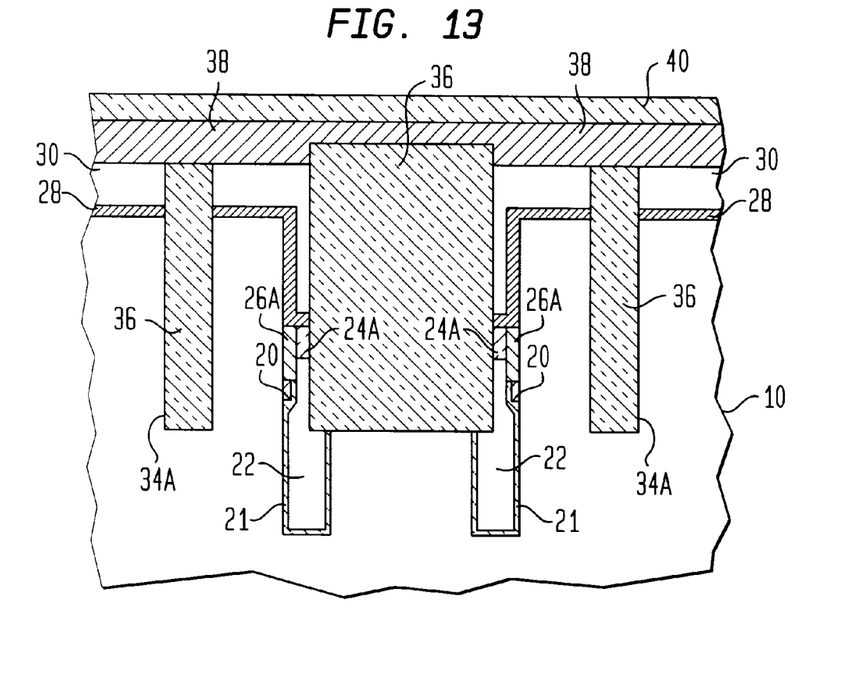

Now there is stripped away the silicon nitride layer 32 to expose the underlying polysilicon 30 and there is then deposited a conductive layer 38 over the surface that will serve as the word line interconnecting each of the gate conductors of a row of transistors. Advantageously, this word line conductor is a metal silicide, such as tungsten or platinum silicide. The conductive layer 38 is then covered with a layer of silicon nitride 40 to provide the structure shown in FIG. 13.

The silicon nitride layer 40 and conductor 38 are then patterned by lithography and etched. In conventional fashion, there are now formed at the top surface 10A of the semiconductor body 10 an n+ type conductivity drain regions 42 of the transistors shown in FIG. 14 to complete the transistors. Each of the two transistors comprises an n+ type conductivity source 43 (formed from the silicon n+ type portion 26A), the gate dielectric 28, the gate 30, and the drain region 42. A separate contact region 44 is connected to each drain region 42. Regions 44 are each connected to a separate bit line. The heating that the semiconductor body 10 has undergone during the various processing can be made to provide sufficient diffusion of donor dopants out of the n+ type source region 43 to effectively extend the boundary of the n+ type region enough to bridge over the portion of silicon oxide layer 28 overlying the remaining portion 24A of TTO layer 24. Additionally, the drain regions 42 actually could have been put in place at various earlier stages of the processing. The remainder of the processing can be conventional. Typically there are provided a number of dielectric layers that are used to isolate the bit and word lines that run over the surface of the semiconductor body 10 and the various contact plugs that are used to interconnect the contact plugs and the word and bit lines.

Figure 14:
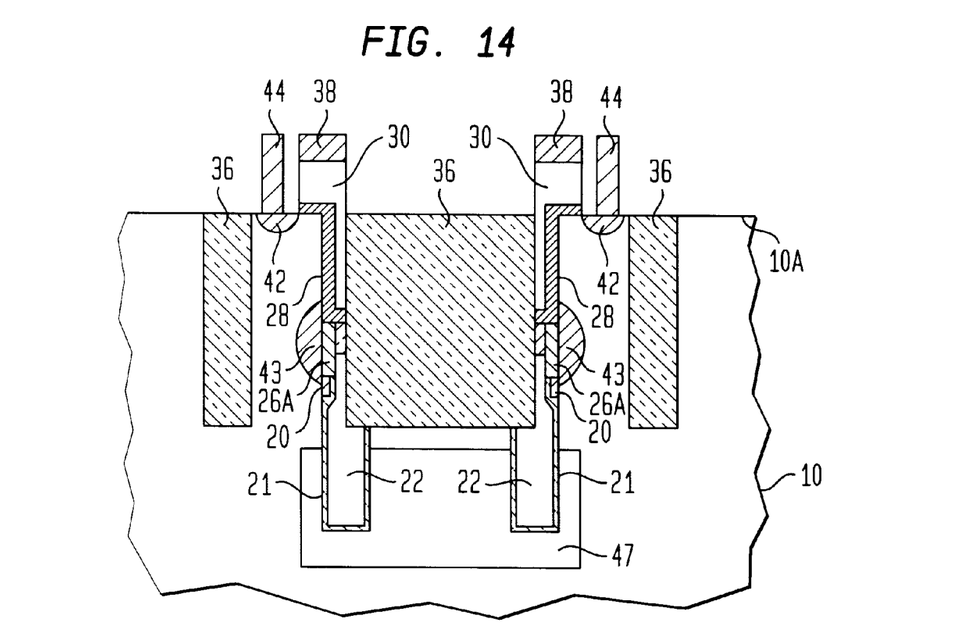

Also shown in FIG. 14 is an optional n+ type conductivity layer 47 that may be used to form a second plate of the storage capacitor.

It can be appreciated that there results a memory cell in which the storage node is formed by the doped polysilicon fill 22 of the deeper portion of a vertical trench 14 and in which the source 43 of the transistor switch is formed along a sidewall at an intermediate portion of the trench, the transistor drain 42 is formed at the top surface 10A of the semiconductor body 10, and a channel of the transistor extends between the source 43 and drain 43 in part along a sidewall portion of the trench and in part along the top surface 10A of the semiconductor body. The dielectric isolation of the polysilicon storage node of the trench is formed both by the portion 24A of the original TTO layer 24 and by the added dielectric layer 28.

It is to be noted that although in this application, the region of the transistor that is connected to the storage node has been described as the source region, as is the usual practice in the art, in operation, the source and drain regions reverse roles in the write-in and read-out operations.

It is to be understood that the embodiment described is illustrative of the general principles of the invention. Various modifications are feasible without departing from the spirit and scope of the invention. In particular, the distinctive feature of the invention is a process that provides a thicker dielectric layer between the polysilicon fill of the trench and the gate conductor than was provided by the prior art process.

What is claimed is:

1. A memory cell for use in a dynamic random access memory of the kind that uses a transistor and a storage capacitor in a semiconductor body comprising:

a relatively deep trench with substantially, vertical side walls that includes a deep portion that is filled with doped polysilicon, that is insulated from the semiconductor body by a dielectric layer and that serves as the storage node of the memory cell, the polysilicon fill also including an oxide layer at its top; and a transistor that includes a drain region that is part of the semiconductor body and a source region that lies in the semiconductor body along a sidewall at top of the polysilicon fill of the deeper portion of the trench, and a channel region extending between the source and drain regions along the top surface of the semiconductor body and along a sidewall of the deep trench that includes vertical and horizontal portions, and a doped silicon gate conductor that fills the upper portion of the trench and is electrically insulated from the doped polysilicon in the deeper portion of the trench both by a dielectric layer that was formed at the top of the polysilicon fill in the deeper portion of the trench and a dielectric layer that was formed as part of the gate dielectric of the transistor.

2. A memory cell for use in a dynamic random access memory of the kind that uses a transistor and a storage capacitor in a semiconductor body comprising:

a relatively deep trench with substantially vertical side walls that includes a deep portion that is filled with doped polysilicon, that is insulated from the semiconductor body by a first and second dielectric layers;

the first dielectric layer lining sidewalls of an upper portion of the deep portion of the trench, and the second dielectric layer lining sidewalls of a lower portion of the deep portion of the trench and lining a surface of the first dielectric layer;

the doped polysilicon having a thermally formed oxide layer at on a top surface thereof;

a transistor that includes a drain region that is part of the semiconductor body and a source region that lies in the semiconductor body along a sidewall at the top of the polysilicon fill of the deeper portion of the trench, and a channel region extending between the source and drain regions along the top surface of the semiconductor body and along a sidewall of the deep trench that includes vertical and horizontal portions, and a doped silicon gate conductor that fills the upper portion of the trench and is electrically insulated from the doped polysilicon in the deeper portion of the trench both by the thermally formed oxide layer that was formed at the top of the polysilicon fill in the deeper portion of the trench and a third dielectric layer that was formed as part of the gate dielectric of the transistor; and a strap at the top of the polysilicon fill of the deeper portion of the trench which connects the polysilicon fill to the source region, the strap extending to contact the gate dielectric.

* * * * *

UNITED STATES PATENT AND TRADEMARK OFFICE
CERTIFICATE OF CORRECTION

PATENT NO.    : 6,255,683 B1
DATED         : July 3, 2001
INVENTOR(S)   : Radens et al.

It is certified that error appears in the above-identified patent and that said Letters Patent is hereby corrected as shown below:

Title page,
Item [73], Assignee, should read -- Infineon Technologies AG of Munich (DE) and International Business Machines Corporation of Armonk, NY --

Signed and Sealed this

Fifth Day of August, 2003

JAMES E. ROGAN
*Director of the United States Patent and Trademark Office*